US008656860B2

(12) United States Patent
Kamian et al.

(10) Patent No.: US 8,656,860 B2
(45) Date of Patent: Feb. 25, 2014

(54) HIGH EFFICIENCY EPITAXIAL CHEMICAL VAPOR DEPOSITION (CVD) REACTOR

(75) Inventors: George Kamian, Scotts Valley, CA (US); Mehrdad M. Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 173 days.

(21) Appl. No.: 12/759,820

(22) Filed: Apr. 14, 2010

(65) Prior Publication Data

US 2010/0267245 A1    Oct. 21, 2010

Related U.S. Application Data

(60) Provisional application No. 61/169,139, filed on Apr. 14, 2010.

(51) Int. Cl.
*B05C 11/00* (2006.01)

(52) U.S. Cl.
USPC ............................ 118/712; 118/715; 118/728

(58) Field of Classification Search
USPC .......................................... 118/712, 715, 728
See application file for complete search history.

(56) References Cited

U.S. PATENT DOCUMENTS

| | | | |
|---|---|---|---|
| 4,043,894 A | 8/1977 | Gibbs | |
| 4,070,206 A | 1/1978 | Kressel et al. | |
| 4,082,570 A | 4/1978 | House et al. | |
| 4,165,252 A | 8/1979 | Gibbs | |
| 4,249,959 A | 2/1981 | Jebens | |
| 4,251,679 A | 2/1981 | Zwan | |
| 4,348,254 A | 9/1982 | Lindmayer | |
| 4,361,950 A | 12/1982 | Amick | |
| 4,409,423 A | 10/1983 | Holt | |
| 4,427,839 A | 1/1984 | Hall | |
| 4,461,922 A | 7/1984 | Gay et al. | |
| 4,468,283 A * | 8/1984 | Ahmed ......................... 117/102 |
| 4,479,847 A | 10/1984 | McCaldin et al. | |
| 4,626,613 A | 12/1986 | Wenham et al. | |
| 4,672,023 A | 6/1987 | Leung | |
| 4,922,277 A | 5/1990 | Carlson | |
| 5,024,953 A | 6/1991 | Uematsu et al. | |
| 5,073,230 A | 12/1991 | Maracas et al. | |
| 5,112,453 A | 5/1992 | Behr et al. | |
| 5,208,068 A | 5/1993 | Davis | |

(Continued)

FOREIGN PATENT DOCUMENTS

| | | |
|---|---|---|
| FR | 2763964 | 12/1998 |
| GB | 2426252 | 11/2006 |

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Kimberly Rizkallah
*Assistant Examiner* — Caleb Henry (57) ABSTRACT

The present disclosure presents a chemical vapor deposition reactor having improved chemical utilization and cost efficiency. The wafer susceptors of the present disclosure may be used in a stackable configuration for processing many wafers simultaneously. The reactors of the present disclosure may be reverse-flow depletion mode reactors, which tends to provide uniform film thickness and a high degree of chemical utilization.

12 Claims, 7 Drawing Sheets

(56) References Cited

U.S. PATENT DOCUMENTS

| | | |
|---|---|---|
| 5,248,621 A | 9/1993 | Sano |
| 5,316,593 A | 5/1994 | Olson et al. |
| 5,348,618 A | 9/1994 | Canham et al. |
| 5,397,400 A | 3/1995 | Matsuno et al. |
| 5,459,099 A | 10/1995 | Hsu |
| 5,494,832 A | 2/1996 | Lehmann et al. |
| 5,538,564 A | 7/1996 | Kaschmitter |
| 5,645,684 A | 7/1997 | Keller |
| 5,660,680 A | 8/1997 | Keller |
| 5,681,392 A | 10/1997 | Swain |
| 5,882,988 A | 3/1999 | Haberern et al. |
| 5,899,360 A | 5/1999 | Mack et al. |
| 5,928,438 A | 7/1999 | Salami |
| 6,091,021 A | 7/2000 | Ruby |
| 6,096,229 A | 8/2000 | Shahid |
| 6,114,046 A | 9/2000 | Hanoka |
| 6,127,623 A | 10/2000 | Nakamura et al. |
| 6,204,443 B1 | 3/2001 | Kiso et al. |
| 6,294,725 B1 | 9/2001 | Hirschberg et al. |
| 6,331,208 B1 | 12/2001 | Nishida et al. |
| 6,399,143 B1 | 6/2002 | Sun et al. |
| 6,416,647 B1 | 7/2002 | Dordi et al. |
| 6,429,037 B1 | 8/2002 | Wenham et al. |
| 6,441,297 B1 | 8/2002 | Keller et al. |
| 6,448,155 B1 | 9/2002 | Iwasaki et al. |
| 6,461,932 B1 | 10/2002 | Wang |
| 6,524,880 B2 | 2/2003 | Moon et al. |
| 6,534,336 B1 | 3/2003 | Iwane |
| 6,555,443 B1 | 4/2003 | Artmann et al. |
| 6,566,235 B2 | 5/2003 | Nishida et al. |
| 6,602,760 B2 | 8/2003 | Poortmans et al. |
| 6,602,767 B2 | 8/2003 | Nishida et al. |
| 6,613,148 B1 | 9/2003 | Rasmussen |
| 6,624,009 B1 | 9/2003 | Green et al. |
| 6,645,833 B2 | 11/2003 | Brendel |
| 6,649,485 B2 | 11/2003 | Solanki et al. |
| 6,653,722 B2 | 11/2003 | Blalock |
| 6,664,169 B1 | 12/2003 | Iwasaki et al. |
| 6,756,289 B1 | 6/2004 | Nakagawa et al. |
| 6,881,644 B2 | 4/2005 | Malik et al. |
| 6,946,052 B2 | 9/2005 | Yanagita et al. |
| 6,964,732 B2 | 11/2005 | Solanki |
| 7,022,585 B2 | 4/2006 | Solanki et al. |
| 7,026,237 B2 | 4/2006 | Lamb |
| 7,147,714 B2 * | 12/2006 | Naito et al. ............ 117/84 |
| 7,312,440 B2 | 12/2007 | Degertekin et al. |
| 7,368,756 B2 | 5/2008 | Bruhns et al. |
| 7,402,523 B2 | 7/2008 | Nishimura |
| 7,648,927 B2 | 1/2010 | Singh et al. |
| 2002/0153039 A1 | 10/2002 | Moon et al. |
| 2002/0168592 A1 | 11/2002 | Vezenov |
| 2002/0179140 A1 | 12/2002 | Toyomura |
| 2003/0017712 A1 | 1/2003 | Brendel |
| 2003/0039843 A1 | 2/2003 | Johnson |
| 2003/0124761 A1 | 7/2003 | Baert |
| 2004/0028875 A1 | 2/2004 | Van Rijn |
| 2004/0173790 A1 | 9/2004 | Yeo |
| 2004/0175893 A1 | 9/2004 | Vatus et al. |
| 2004/0192044 A1 | 9/2004 | Degertekin et al. |
| 2004/0259335 A1 | 12/2004 | Narayanan |
| 2004/0265587 A1 | 12/2004 | Koyanagi |
| 2005/0160970 A1 | 7/2005 | Niira |
| 2005/0172998 A1 | 8/2005 | Gee et al. |
| 2005/0176164 A1 | 8/2005 | Gee et al. |
| 2005/0177343 A1 | 8/2005 | Nagae |
| 2005/0199279 A1 | 9/2005 | Yoshimine et al. |
| 2005/0274410 A1 | 12/2005 | Yuuki et al. |
| 2005/0281982 A1 | 12/2005 | Li |
| 2006/0021565 A1 | 2/2006 | Zahler et al. |
| 2006/0043495 A1 | 3/2006 | Uno |
| 2006/0054212 A1 | 3/2006 | Fraas et al. |
| 2006/0070884 A1 | 4/2006 | Momoi et al. |
| 2006/0105492 A1 | 5/2006 | Veres et al. |
| 2006/0196536 A1 | 9/2006 | Fujioka |
| 2006/0231031 A1 | 10/2006 | Dings et al. |
| 2006/0252243 A1 * | 11/2006 | Kishimoto et al. ............ 438/607 |
| 2006/0266916 A1 | 11/2006 | Miller et al. |
| 2006/0283495 A1 | 12/2006 | Gibson |
| 2006/0286775 A1 | 12/2006 | Singh et al. |
| 2007/0077770 A1 | 4/2007 | Wang et al. |
| 2007/0082499 A1 | 4/2007 | Jung et al. |
| 2008/0047601 A1 | 2/2008 | Nag et al. |
| 2008/0157283 A1 | 7/2008 | Moslehi |
| 2008/0210294 A1 | 9/2008 | Moslehi |
| 2008/0241384 A1 | 10/2008 | Jeong et al. |
| 2008/0264477 A1 | 10/2008 | Moslehi |
| 2008/0289684 A1 | 11/2008 | Moslehi |
| 2008/0295887 A1 | 12/2008 | Moslehi |
| 2009/0042320 A1 | 2/2009 | Wang et al. |
| 2009/0107545 A1 | 4/2009 | Moslehi |
| 2009/0301549 A1 | 12/2009 | Moslehi |
| 2010/0022074 A1 | 1/2010 | Wang et al. |
| 2010/0116316 A1 | 5/2010 | Moslehi et al. |

FOREIGN PATENT DOCUMENTS

| | | |
|---|---|---|
| JP | 06-260670 A | 9/1994 |
| JP | 2002-2299661 A | 10/2002 |
| WO | PCT/EP1999/008573 | 5/2000 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al., Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

(56) References Cited

OTHER PUBLICATIONS

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, 1996, May 13-17, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

\* cited by examiner

HIGH EFFICIENCY EPITAXIAL CHEMICAL VAPOR DEPOSITION (CVD) REACTOR

CROSS-REFERENCE TO RELATED APPLICATIONS

This application claims priority to U.S. Provisional Patent Application Ser. No. 61/169,139, which is hereby incorporated by reference in its entirety.

FIELD

The present disclosure relates to epitaxial deposition. More particularly, the present disclosure relates to epitaxial deposition of silicon or other semiconducting materials.

BACKGROUND

Monocrystalline silicon is the most dominant material for photovoltaic applications. The high efficiencies associated with monocrystalline solar cells, combined with the abundance of material, garner appeal for continued use and advancement. But the high processing cost of crystalline silicon material limits the widespread use of these solar modules. At present, the cost of "wafering," or crystallizing silicon and cutting a wafer, accounts for about 40% finished solar cell cost. If a more direct way of making wafers were possible, great headway could be made in lowering the cost of solar cells.

There are different known methods of growing monocrystalline silicon and releasing or transferring the grown wafer. Regardless of the method, a low cost epitaxial deposition process is assumed.

Silicon epitaxial (epi) deposition was originally developed for the semiconductor industry. The requirements for the semiconductor industry, in both film properties and cost, are nearly polar opposites of requirements in the solar field. For example, semiconductor epi films are typically less than 5 μm (1 μm=$10^{-6}$ meter) thick, while solar requires 60-80 μm of silicon. In order to achieve economies in the solar industry, the silicon cost per watt must reside in the \$0.25/watt or approximately \$1.00/wafer (assuming a 4 watt cell).

The precursor chemistry for epi is predominantly trichlorosilane (TCS), although for thinner films silane ($SiH_4$) may also be used. Epitaxial deposition for each chemical poses unique requirements and challenges in both equipment architecture and process conditions. Based on low cost and abundance, TCS is the chemistry of choice for the solar industry. The present disclosure will generally be described with regard to TCS, but one of ordinary skill in the art will recognize its applications to silane and other precursor chemicals.

In order to achieve the necessary economy for solar applications, process cost modeling is studied to identify and optimize equipment performance. Three categories of cost make up the total cost picture: fixed cost (FC), recurring cost (RC) and yield cost (YC). FC is made up of items such as equipment purchase price, installation cost, and robotics or automation cost. RC is largely made up of electricity, gases, chemicals, operator salaries, and maintenance technician support. YC may be interpreted as the total value of parts lost during production.

To achieve the cost of ownership (CoO) numbers required by the solar field, all aspects of the cost picture must be optimized. The qualities of a low-cost process are (in order of priority): 1) high productivity, 2) high yield, 3) low RC, and 4) low FC.

Designing highly productive equipment requires a good understanding of the process requirements and reflecting those requirements in the architecture. High yield requires a robust process and reliable equipment. Low RC turns out to be the dominant component in the cost model. RC can impact plant site selection based on, for example, cost of local power or availability of bulk chemicals. FC, although important, is diluted by equipment productivity.

With the above said, in summary, a highly productive, reliable, efficient reactor may be essential for the production of low cost solar cells.

SUMMARY

Therefore, it is an object of the present disclosure to provide a CVD reactor having improved chemical utilization and high yield, and thereby reduce costs and improve efficiency.

Achieving low RC requires efficient use of chemicals. In an effort to make use of a greater portion of TCS, a longer deposition zone will be described. Providing a longer deposition zone may allow a higher percentage of the TCS to be deposited. In this way, greater chemicals utilization may be realized. By choosing the optimal parameters (chemical concentration, gas speed, reaction dimensions, etc.), productivity and chemical utilization may be optimized. A further object of the present disclosure is minimization of deposition on surfaces other than the wafers, which is also important for effective chemical utilization. The disclosed reactor has a high wafer area to reactor surface area ratio, which tends to minimize parasitic losses.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description be within the scope of the claims.

BRIEF DESCRIPTION OF THE DRAWINGS

The features, nature, and advantages of the disclosed subject matter may become more apparent from the detailed description set forth below when taken in conjunction with the drawings in which like reference numerals indicate like features and wherein.

DETAILED DESCRIPTION

Although the present disclosure is described with reference to specific embodiments, one skilled in the art could apply the principles discussed herein to other areas and/or embodiments without undue experimentation.

The present disclosure references a "template," which may be viewed as equivalent to a "wafer." In one embodiment of the present disclosure, the template, after epitaxy, may be used repeatedly to grow and release crystalline wafers. But the use to which the template or wafer is put after epitaxial deposition is beyond the scope of the present disclosure: one of ordinary skill will recognize the myriad uses to which the template might be put without departing from the spirit of the present disclosure.

One novel aspect of the reactor of the present disclosure lies in the arrangement of the wafer susceptors (a susceptor is a material used for its ability to absorb electromagnetic energy and impart that energy, in the form of heat, to the wafers). Although the susceptors may be heated electromagnetically, lamps or resistive heating may also be effective.

Figure 1:
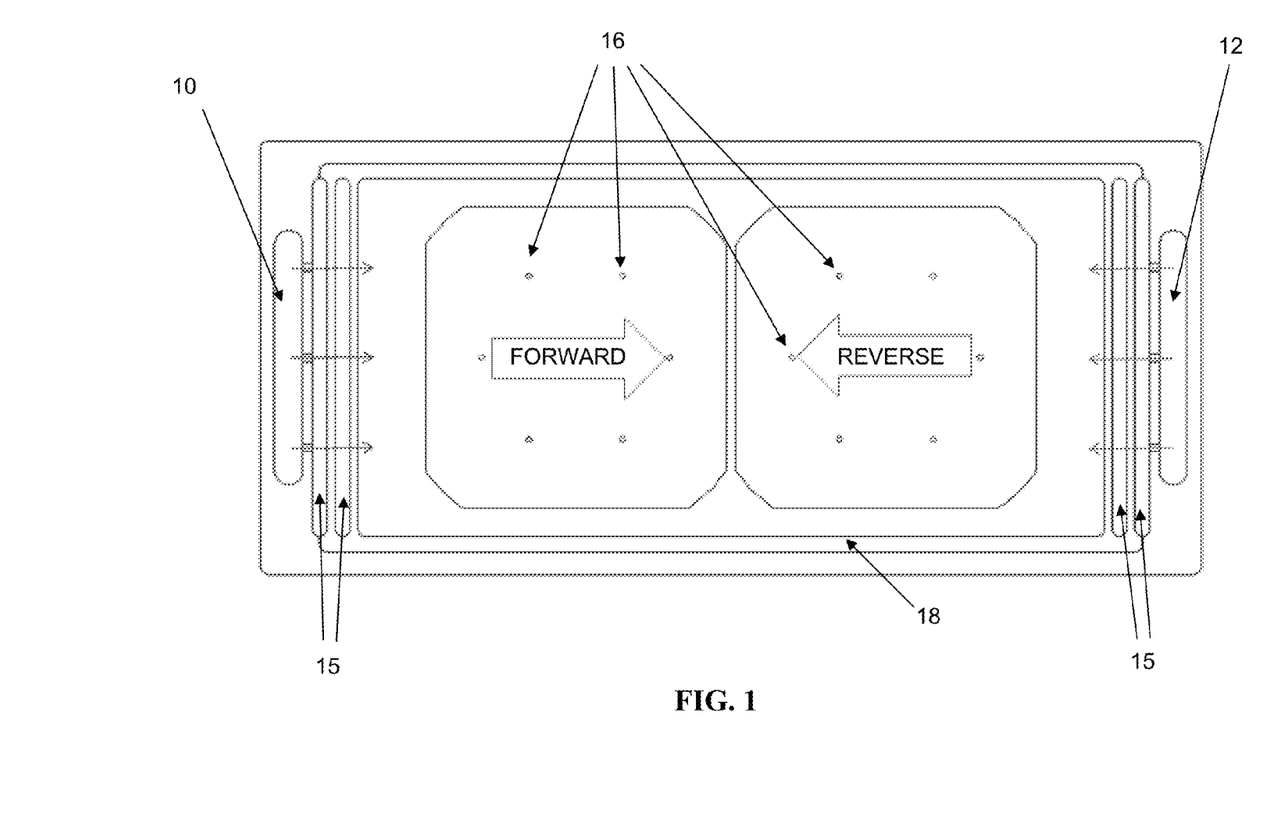
FIG. 1 shows a top view of an embodiment of a wafer susceptor.
Figures 2A, 2B:
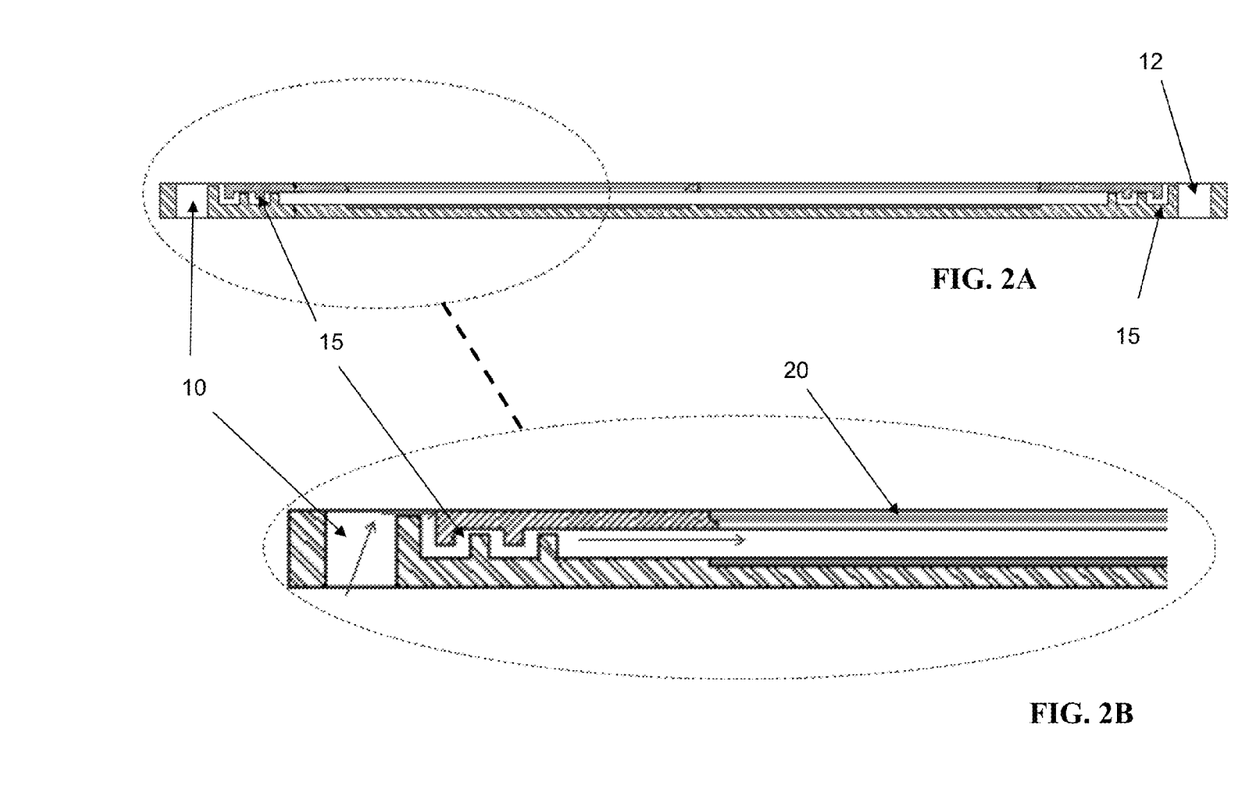
FIGS. 2A and 2B show a side view and an enlarged side view, respectively, of an embodiment of a wafer susceptor.

The susceptors of the present disclosure may be stackable, yet they do not rely on stacking for providing the "building blocks" of the overall reactor. The reactors of the present disclosure may or may not be depletion mode reactors (DMRs). "Depletion mode" refers to the depletion or utilization of chemical along the direction of gas flow. As shown in FIG. 1, that direction may be reversed to even out film thickness from one end to the other. In embodiments where the direction is not reversed, a tendency to deposit more chemicals in the region closest to the source port may be exhibited. In a forward-flow (i.e. left-to-right) mode, port 10 comprises a source port, and port 12 comprises an exhaust port; in a reverse-flow mode, the opposite is true. For that reason, port 10 may be referred to as "source/exhaust port 10," and port 12 may be referred to as "exhaust/source port 12." FIGS. 1, 2A, and 2B show different views of the same susceptor arrangement: a top view, a side view, and a detail side view, respectively. As shown in FIGS. 2A and 2B, the design of ports 10 and 12 lends itself to the stackable nature of the wafer susceptors of the present disclosure.

Baffle channels 15 are shown in FIGS. 1, 2A, and 2B. These baffle channels comprise a part of the path through which the TCS or other chemical species flows. Pin holes 16, shown in FIG. 1 only, provide template lift during the epitaxial deposition process.

In these views, template 20 (shown in FIG. 2B) is shown inserted into insert pocket 18 (shown in FIG. 1).

The various dimensions of the reactor shown may be varied by one of ordinary skill without departing from the spirit of the present invention.

In this exemplary embodiment, the thickness of insert pocket 18 is approximately 6 mm, and the length of the whole assembly is approximately 50 cm. The diameter of ports 10 and 12 may be approximately 15 mm.

Figure 3:
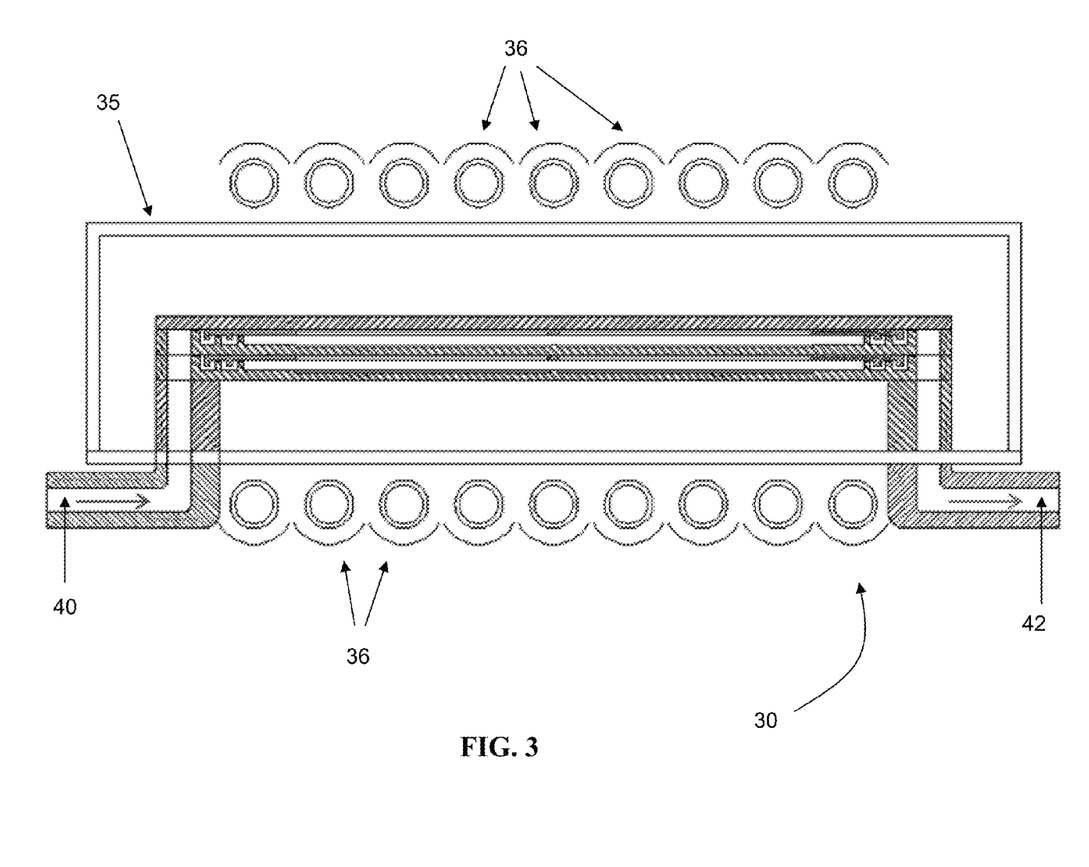
FIG. 3 shows a side view of an embodiment of a reactor with two sets of susceptor plates.

FIG. 3 shows reactor 30, which includes two sets of stacked susceptor plates, similar to the susceptor plates shown in the preceding three FIGURES. The reactor of FIG. 3 is a depletion mode reactor.

Reactor 30 includes source/exhaust port 40 and exhaust/source port 42. The maid body of reactor 30 is housed in quartz muffle 35. As shown, reactor 30 uses lamps 36 for heating the susceptor plates.

During the reaction (or reduction) of TCS with hydrogen gas, hydrochloric acid (HCl gas) is produced. In fact, if the reaction were fed with additional $H_2$ and allowed to extend over a longer zone or time, the concentration of HCl could continue to rise past the point of reaction inhibition and begin to etch the silicon template. While this is generally a state to be avoided, etching of silicon may be employed to clean the downstream exhaust passages. In effect, by allowing a sufficient level of HCl to build up, one could operate the reactor of the present disclosure in a self-maintaining mode by having the produced HCl gas etch away unwanted deposited silicon.

Figure 4:
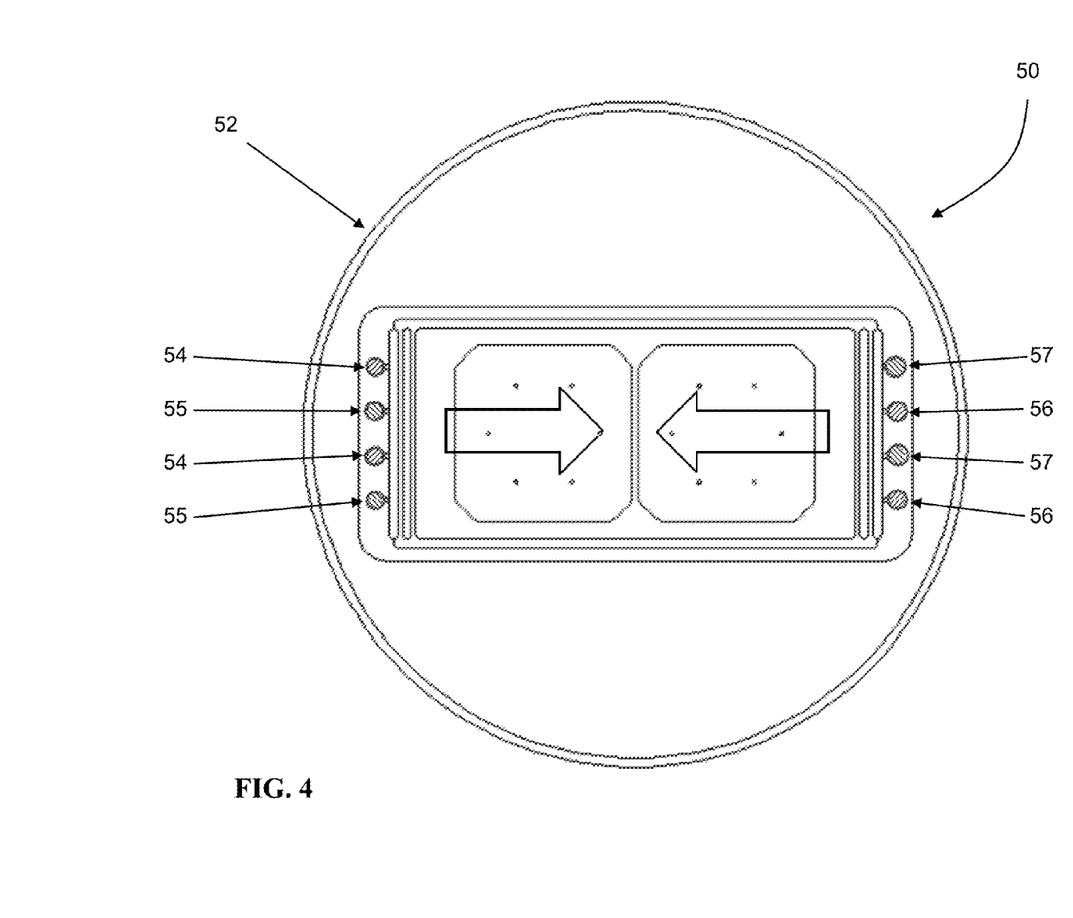
FIG. 4 shows a top view of a batch stack reactor (BSR) embodiment.

FIG. 4 shows reactor 50, an embodiment of the present disclosure known as a batch stack reactor (BSR). In this configuration, the susceptor plates are stacked to increase the batch load to, in some embodiments, several hundred wafers. By purging the exterior of the susceptors with $H_2$ gas, the quartz bell jar is protected from silicon deposition. Most known bell jar reactors are not protected from TCS and require periodic HCl cleaning to remove unwanted deposited silicon. This process may interrupt production, thereby adversely affecting the cost per wafer (i.e. CoO).

Reactor 50 is housed in quartz bell jar 52. In the embodiment shown, reactor 50 includes separate ports for TCS and $H_2$, although this is not a necessary feature of the present disclosure; in other embodiments, TCS and $H_2$ may be premixed and fed through the same ports. As shown, $H_2$ source/exhaust ports 54 and TCS source/exhaust ports 55 are at one end of the reactor; $H_2$ exhaust/source ports 56 and TCS exhaust/source ports 57 are at the other end. These ports may be differentiated only when acting as source ports. When a given port is being used in an exhaust capacity, it will be exhausting gas that has already been mixed inside the reactor.

TCS reduction with $H_2$ may result when the gases are mixed at the appropriate temperature. FIG. 4 shows an arrangement of separating the precursors until the point of use at each susceptor. This method may further extend chemical utilization and runtime favoring further improved CoO.

Figure 5A:
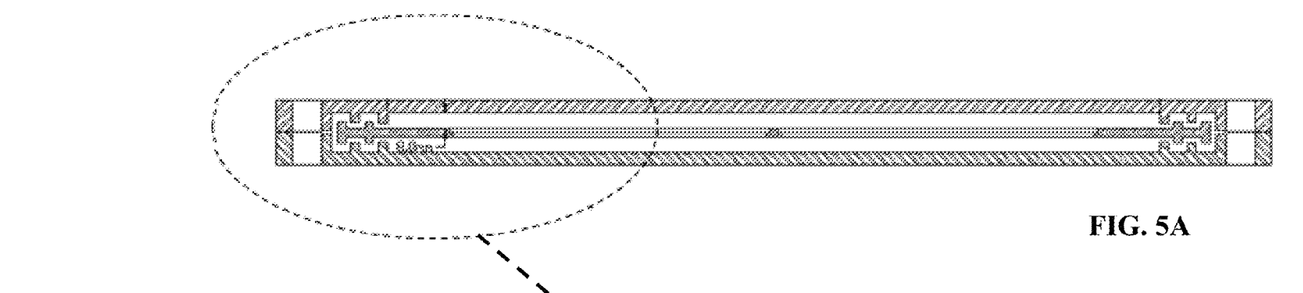
FIGS. 5A and 5B show a side view and an enlarged side view, respectively, of an embodiment of a double-sided deposition (DSD) susceptor arrangement.
Figure 5B:
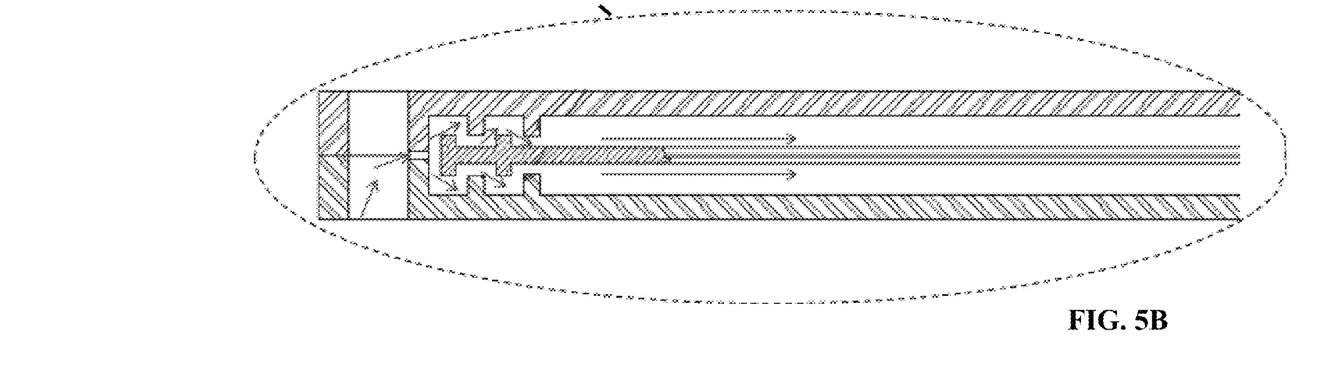

In the arrangement shown in FIGS. 5A and 5B, each template is exposed to process gases on both sides. This feature enables dual side deposition, which has a compounding effect of both increased chemical utilization and lower epi cost per wafer.

The susceptors shown in FIGS. 5A and 5B are generally similar in use to the ones shown in FIGS. 2A and 2B, and may be incorporated into various types of reactor configurations.

Figure 6:
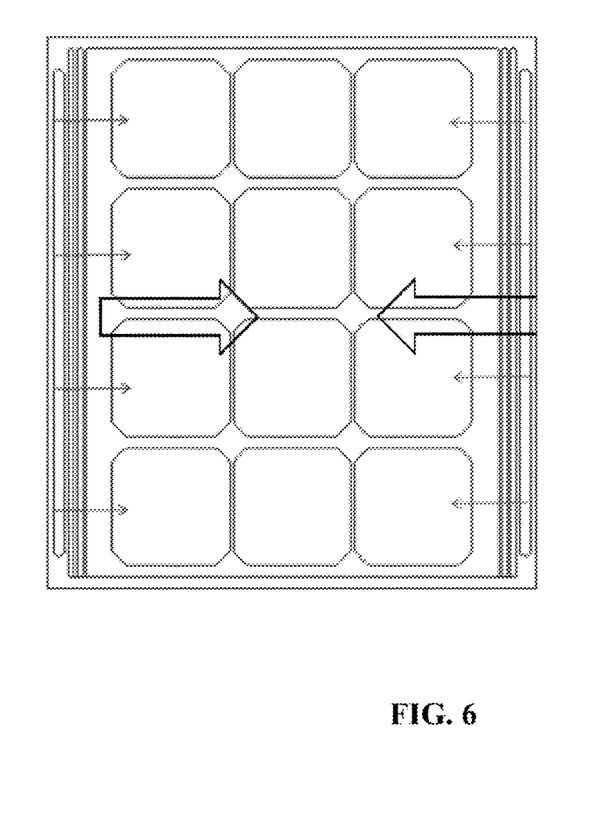
FIG. 6 shows a top view of an embodiment comprising an array of susceptors.

The dual sided susceptors may be stackable (as shown in the embodiment of FIG. 3), yet they may also be arranged in a matrix as shown in FIG. 6.

Figure 7:
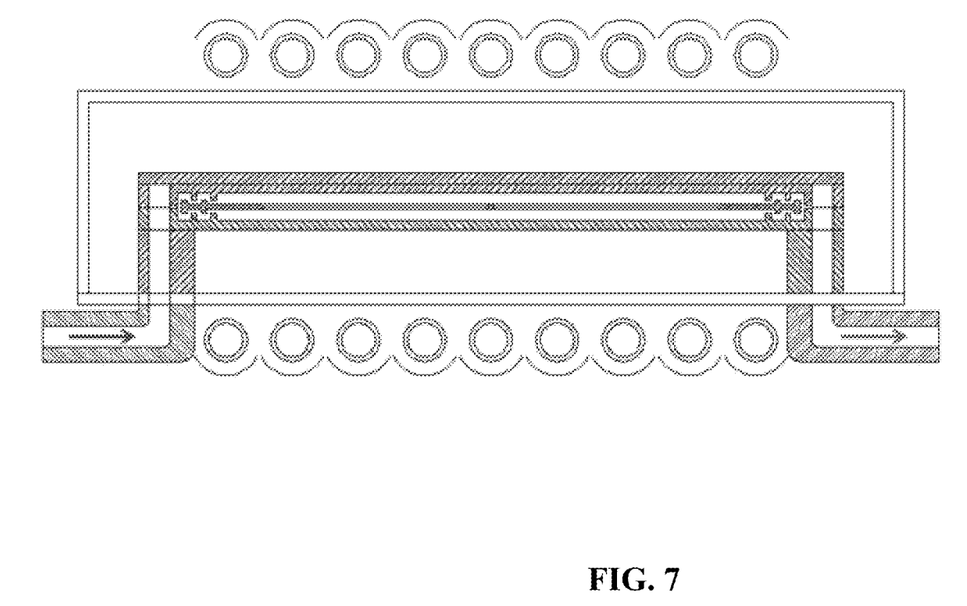
FIG. 7 shows a side view of an embodiment of a double-sided deposition reactor.

FIG. 7 shows a side view of a depletion mode reactor using the dual sided susceptors of FIGS. 5A and 5B. It is generally similar in structure to the reactor shown in FIG. 3, but with a dual sided susceptor in place of the stacked susceptors.

Those with ordinary skill in the art will recognize that the disclosed embodiments have relevance to a wide variety of areas in addition to those specific examples described above. In particular, any of the disclosed susceptors could be placed into any of the disclosed reactor arrangements without undue experimentation by one of ordinary skill in the art.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A depletion mode reactor for depositing a chemical on a first surface of a plurality of wafers simultaneously according to a chemical vapor deposition process, said reactor comprising:
   a reversible first port positioned on a first side of a first surface of a wafer and providing the supply or exhaust of a chemical;
   a plurality of first baffle channels, each of said first baffle channels coupled to said first port and through each of which a chemical may flow to a wafer insert pocket;
   a plurality of vertically stacked susceptor plates, each comprising a wafer insert pocket exposing a first surface of a wafer to said chemical, each of said wafer insert pockets being coupled to a first baffle channel and a second baffle channel, said vertically stacked susceptor plates providing a flow path for said chemical across a first surface of each of said wafers;
   a plurality of second baffle channels, each of said second baffle channels coupled to a second reversible port and through each of which a chemical may flow to said wafer insert pocket; and
   a reversible second port positioned on a second side of a first surface of a wafer and providing the supply or exhaust of a chemical;
   said reversible ports, said baffle channels, and said plurality of vertically stacked susceptor plates providing a chemical flow path;
   wherein said first reversible port and said reversible second port are capable of operating in either a supply mode or an exhaust mode to alternate the flow of chemical across said first surface of said wafer.

2. The reactor of claim 1, further comprising a heating lamp.

3. The reactor of claim 2, further comprising a quartz muffle.

4. The reactor of claim 1, further comprising a quartz muffle.

5. The reactor of claim 1 wherein said reactor is a batch stack reactor and said vertically stacked susceptor plates each comprise a plurality of wafer insert pockets arranged in a horizontal matrix.

6. The reactor of claim 1 wherein said reversible first port comprises a plurality of reversible first ports having at least one TCS source port and at least one $H_2$ source port, and said reversible second port comprises a plurality of second ports having at least one TCS source port and at least one $H_2$ source port.

7. A depletion mode reactor for depositing a chemical on a first primary surface and a second primary surface of a plurality of wafers simultaneously according to a chemical vapor deposition process, said reactor comprising:
   a reversible first port positioned on a first side of said first primary surface and said second primary surface of a wafer and providing the supply or exhaust of a chemical;
   a plurality of first double-sided baffle channels, each of said first double-sided baffle channels coupled to said first port and through each of which a chemical may flow to a wafer insert pocket;
   a plurality of vertically stacked dual sided susceptor plates each comprising a wafer insert pocket for exposing said first primary surface and said second primary surface of said wafer to said chemical, each of said wafer insert pockets being coupled to said first double-sided baffle channel and a second double-sided baffle channel, said vertically stacked dual sided susceptor plates providing a flow path for said chemical across a first surface of each of said wafers;
   a plurality of second double-sided baffle channels, each of said second double-sided baffle channels coupled to a second reversible port and through each of which a chemical may flow to said wafer insert pocket; and
   a reversible second port positioned on a second side of said first primary surface and said second primary surface of a wafer and providing the supply or exhaust of a chemical;
   said reversible ports, said double-sided baffle channels, and said plurality of vertically stacked susceptor plates providing a chemical flow path;
   wherein said reversible first port and said reversible second port are capable of operating in either a supply mode or an exhaust mode to alternate the flow of chemical across said first primary surface and said second primary surface of said wafer.

8. The reactor of claim 7, further comprising a heating lamp.

9. The reactor of claim 8, further comprising a quartz muffle.

10. The reactor of claim 7, further comprising a quartz muffle.

11. The reactor of claim 7 wherein said reactor is a batch stack reactor and said vertically stacked susceptor plates each comprise a plurality of wafer insert pockets arranged in a horizontal matrix.

12. The reactor of claim 7 wherein said reversible first port comprises a plurality of reversible first ports having at least one TCS source port and at least one $H_2$ source port, and said reversible second port comprises a plurality of second ports having at least one TCS source port and at least one $H_2$ source port.

* * * * *